United States Patent [19]

Angulas et al.

[11] Patent Number: 5,278,724

[45] Date of Patent: Jan. 11, 1994

[54] ELECTRONIC PACKAGE AND METHOD OF MAKING SAME

[75] Inventors: Christopher G. Angulas, Johnson City; Thomas E. Kindl, Endwell, both of N.Y.

[73] Assignee: International Business Machines Corporation, Armonk, N.Y.

[21] Appl. No.: 909,520

[22] Filed: Jul. 6, 1992

[51] Int. Cl.$^5$ ............................................. H05K 7/20
[52] U.S. Cl. .................................... 361/707; 174/254; 439/67; 361/717
[58] Field of Search ................... 174/254; 361/383, 386–389, 398, 400, 413; 439/67, 77, 487, 876

[56] References Cited

U.S. PATENT DOCUMENTS

| | | |
|---|---|---|
| 3,825,803 | 7/1974 | Budde . |
| 4,495,546 | 1/1985 | Nakamura et al. ............... 361/398 |
| 4,547,834 | 10/1985 | Dumont et al. . |
| 4,550,357 | 10/1985 | Mutsumoto . |
| 4,628,408 | 12/1986 | Kimura . |
| 4,691,972 | 9/1987 | Gordon . |
| 4,824,379 | 4/1989 | Roberts et al. . |
| 4,843,520 | 6/1989 | Nakatani et al. . |
| 4,859,189 | 8/1989 | Petersen et al. . |
| 4,885,126 | 12/1989 | Polonio . |
| 4,886,461 | 12/1989 | Smith . |
| 4,996,585 | 2/1991 | Gruber et al. . |
| 5,018,005 | 5/1991 | Lin et al. ............................. 361/398 |

OTHER PUBLICATIONS

Franck et al., "Microcircuit Module And Connector", IBM Tech. Discl. Bulletin, vol. 13, No. 7, Dec. 1970, pp. 1786–1787.

Primary Examiner—Gregory D. Thompson
Attorney, Agent, or Firm—Lawrence R. Fraley

[57] ABSTRACT

An electronic package and method of making same wherein the package includes a first substrate (e.g., printed circuit board), a second, flexible circuitized substrate (e.g., polyimide dielectric with conductors thereon) having a semiconductor device (chip) electrically coupled thereto. The outer portions of the flexible circuitized substrate are wrapped about the frame which in turn includes portions thereof which serve to spacedly position the wrapped flexible substrate with respect to the first substrate such that conductors on both substrates may be precisely aligned and electrically coupled in a permanent manner. A method of assembling the invention, including the use of a vacuum head and appropriate heat thermodes, is also defined.

23 Claims, 4 Drawing Sheets

ELECTRONIC PACKAGE AND METHOD OF MAKING SAME

The invention relates to electronic packages and particularly to such packages which utilize flexible circuitry and semiconductor devices (chips) as part thereof. Even more particularly, the invention relates to such packages which may be used in the information handling systems (computer) field.

BACKGROUND OF THE INVENTION

Electronic packages of the variety described above are known in the art, with examples defined in detail in U.S. Pat. Nos. 4,849,856 (Funari et al), 4,914,551 (Anschel et al), 5,003,429 (Baker et al) and 5,009,393 (Bentlage et al), all of which are assigned to the same assignee as the present invention. As defined therein, these packages may include a chip electrically coupled to one side of a flexible circuit member which is typically of a dielectric, e.g., polyimide, having at least one layer of circuitry, e.g., copper, thereon. Such a chip may be coupled, electrically, to the flexible circuit member's circuitry using solder, one well known technique currently used by the assignee of the present invention and referred to as a controlled collapse chip connection (a/k/a C4) procedure. The flexible circuit (a/k/a tape) may then be coupled electrically to respective circuitry, e.g., copper pads or lines, formed on the top surface of a printed circuit board or the like. Such boards, usually comprised of several layers of dielectric material, e.g., fiberglass-reinforced epoxy resin, interspersed with various conductor levels, e.g., power, signal and/or ground planes, are known in the art and further definition is not believed necessary. Finally, such packages typically utilize a heat sink member which is thermally coupled to the chip to enhance heat removal from the completed package during operation. Such a heat sink usually comprises a metallic, e.g., aluminum, element located atop the board with appropriate "feet" firmly oriented on the board's upper surface externally of the aforementioned flexible circuit. The heat-generating chip may be thermally coupled to the heat sink using an appropriate thermal adhesive, several of which are known in the art. To further promote heat removal, the heat sink typically includes appropriate fins or the like at designated locations thereon.

It is known in package assemblies of the type defined above to electrically couple the outer leads of the flexible circuit to the respective conductors on the circuit board using solder. In one known technique for soldering such leads, the dielectric material of the flexible circuit member is removed (etched away) along the flexible circuit's periphery to expose the terminal ends of the outer lead conductors. Solder is applied to the board's conductors and the outer leads are aligned therewith and positioned on the solder. Heat is then applied, e.g., using a thermode structure, to effect the solder bond between respective pairs of conductors (flexible circuit and board). Such a form of connection requires that each of the relatively small terminal ends of the outer leads be substantially entirely free of dielectric, which has proven to be an expensive and time-consuming process, typically involving etching of the dielectric material using known etchants. Use of acids and caustics at elevated temperatures during such processing may also prove undesirable from an environmental standpoint.

The electronic package and method of making same in accordance with the teachings of the instant invention eliminate the need for such dielectric removal (and thus the need for an etching or the like process at this stage), while still assuring precise orientation and electrical coupling (e.g., soldering) of the flexible circuit's outer lead conductors to respective conductors on the package's circuit board structure. The invention is capable of being readily implemented at reduced cost, and is also adaptable to mass production techniques for packaging structures.

It is believe that such an electronic package assembly and method of making same would constitute a significant advancement in the art.

DISCLOSURE OF THE INVENTION

It is, therefore, a primary object of the present invention to enhance the art of electronic packages and particularly those packages for use in the computer industry.

It is another object of the invention to provide an electronic package which overcomes the aforementioned disadvantages of various known packages.

It is a still further object of the invention to provide an electronic package which can be produced in a relatively inexpensive manner, and which is adaptable to mass production techniques for such packages.

In accordance with one aspect of the invention, there is defined an electronic package which includes a first circuitized substrate (e.g., a printed circuit board), a frame having at least part thereof positioned a predetermined distance from the board, and a flexible circuit secured to the frame and including at least one part thereof wrapped about the part of the frame located at the spaced distance from the circuit board. Selected ones of conductors on the flexible circuit are coupled, electrically, to respective conductors on the board. The package further includes a semiconductor device (e.g., chip) which is electrically coupled to the selected ones of the flexible circuit's conductors, thus providing electrical connection between the chip and the board along predetermined conductive paths, without the need for dielectric removal or the like as has been customary in some prior packages wherein such connections have been utilized.

In accordance with another aspect of the invention, there is provided a method of making an electronic package which comprises the steps of providing a first circuitized substrate (e.g., circuit board), providing a flexible circuitized substrate, securing the flexible circuitized substrate to a frame such that part of the flexible circuit is wrapped about part of the frame, spacedly positioning the part of the frame having the flexible circuit wrapped thereabout at a distance from the circuit board and electrically coupling selected ones of conductors on the flexible circuit to respective conductors on the board, and positioning a semiconductor device (e.g., chip) on the flexible circuit and electrically coupling the chip to the selected ones of the conductors on the flexible circuit.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
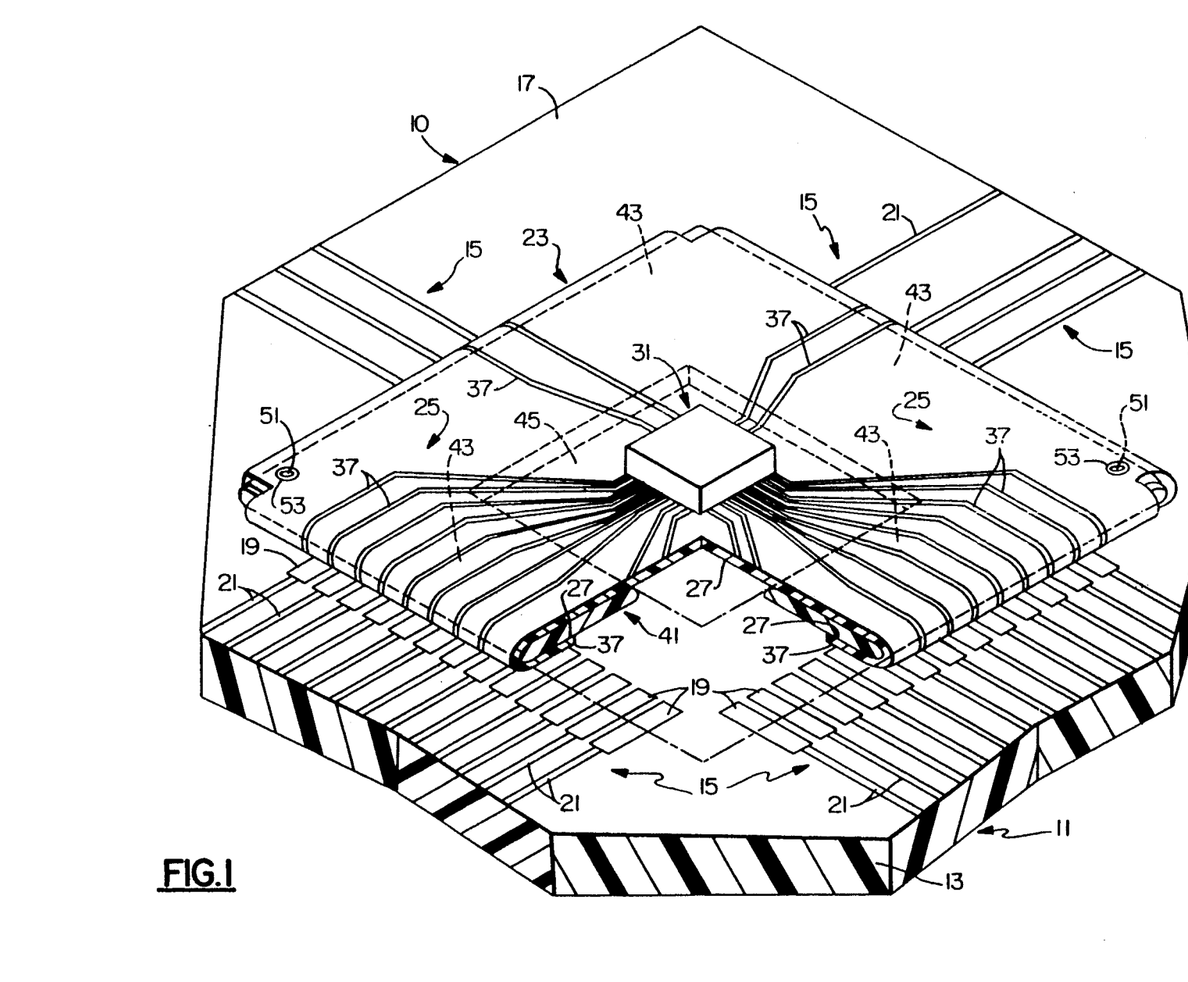
FIG. 1 is a partial perspective view of an electronic package in accordance with one embodiment of the invention.

In FIG. 1, there is shown an electronic package 10 in accordance with one embodiment of the invention. Package 10 includes a first circuitized substrate 11 which, in a preferred embodiment of the invention, is a multilayered printed circuit board. Such boards are known in the art and typically include at least one (and preferably several) layer of dielectric material 13 (e.g., epoxy resin reinforced with fiberglass) and a plurality of conductive planes (e.g., signal, power and/or ground) as part thereof. In the embodiment of FIG. 1, only one such conductive plane is illustrated, that being a plurality of signal conductors 15 located on a top surface of substrate 11.

In a preferred embodiment, selected ones of the conductors 15 include a substantially rectangular pad 19, forming a predefined pattern (e.g., rectangular) of such pads on surface 17. The pattern depicted in FIG. 1 is for illustration purposes, only, and not meant to limit the present invention. Pads 19, in the embodiment of FIG. 1, are electrically coupled to or form extensions of a plurality of signal lines 21 which, as shown, fan out in a predetermined pattern to thus form the circuitry for the first substrate 11. Conductors 15 are preferably of copper or other known conductive material as used in the art and may be applied using techniques also known in the art for producing circuit boards of the type defined herein. Further description is thus not believed necessary.

Package 10 further includes a flexible circuitized substrate 23 which, in turn, includes a second plurality of conductors 25 as part thereof. Flexible circuitized substrate 23, in accordance with a preferred embodiment of the invention, comprises a relatively thin layer of dielectric material 27 (e.g., polyimide) having thereon the conductors 25. Conductors 25 are preferably provided using known techniques in the art of manufacturing flexible circuits, including sputtering or plating on the dielectric layer, and imaging using a suitable photoresist system. Alternatively, the conductive pattern on substrate 23 may be provided by lamination of a metal (e.g., copper) layer to the dielectric layer, using heat and pressure, and possibly an adhesive, followed by imaging with a photoresist and etching. These techniques are known in the art for producing a circuitized substrate which is flexible in nature. By way of example, a preferred flexible substrate for use in the invention possessed a dielectric thickness of about 0.002 inch with a corresponding metallic layer having a thickness of about 0.0014 inch, thus giving an overall thickness for the flexible circuit of about 0.0034 inch.

It is understood that, in accordance with the teachings of the present invention, there is provided an electronic package and a method of assembling same wherein the fine pattern of conductors 25 on the flexible circuitized substrate 23 are precisely aligned and electrically coupled to respective conductors 15 on the first substrate 11. As defined herein, this connection is attainable without the requirement for selective removal of end portions of the flexible substrate's dielectric so as to expose only terminal ends of the conductors 25, as has heretofore been required in some package assemblies using these structures. In accordance with the teachings herein, the invention defines a technique whereby such dielectric removal is eliminated, while still assuring precise alignment and connection in the manner taught herein.

In one embodiment of the invention, a pattern of conductors 25 on the flexible circuitized substrate 23 each having a width of only about 0.005 inch and separated from adjacent such conductors by a distance of only about 0.007 inch are capable of being electrically coupled to corresponding conductors 15 having a width of only about 0.008 inch and spaced from the nearest adjacent such conductor at a distance of only about 0.004 inch. Such close positioning of both pairs of mating conductors as defined herein thus represents a high density pattern of such conductors and further illustrates the preciseness attained using the teachings of the present invention.

Electrically coupled to the inner lead portions of conductors 25 on substrate 23 is at least one semiconductor device (e.g., chip) 31. Device 31 may be of a known type of semiconductor chip and, in one embodiment of the invention, included the illustrated substantially rectangular, box-like configuration having side dimensions of about 0.500 inch by 0.500 inch and a thickness of only about 0.025 inch. The contact sites located on the underside of the device as illustrated in FIG. 1 are, in accordance with a preferred embodiment of the invention, electrically coupled to the internal terminal ends 33 (FIG. 2) of the conductors 25 using a known soldering operation, referred to in the art as controlled collapse chip connection (a/k/a C4). Such solder connections are illustrated by the spherical solder balls 32 in FIG. 2. Further description for this form of connection between device 31 and the circuitry of flexible substrate 23 is not believed necessary. Conductors 25, like conductors 15, fan out from these inner terminal ends 33 to form the eventual pattern of circuitry on the flexible substrate's upper surface. This pattern as shown in FIG. 1 thus includes a plurality of signal lines 37 which extend outwardly from device 31 to the outer periphery of substrate 23. This is also illustrated in FIG. 2 wherein circuit lines 37 are shown to extend substantially flush to the ends of the underlying dielectric 27.

Figure 2:
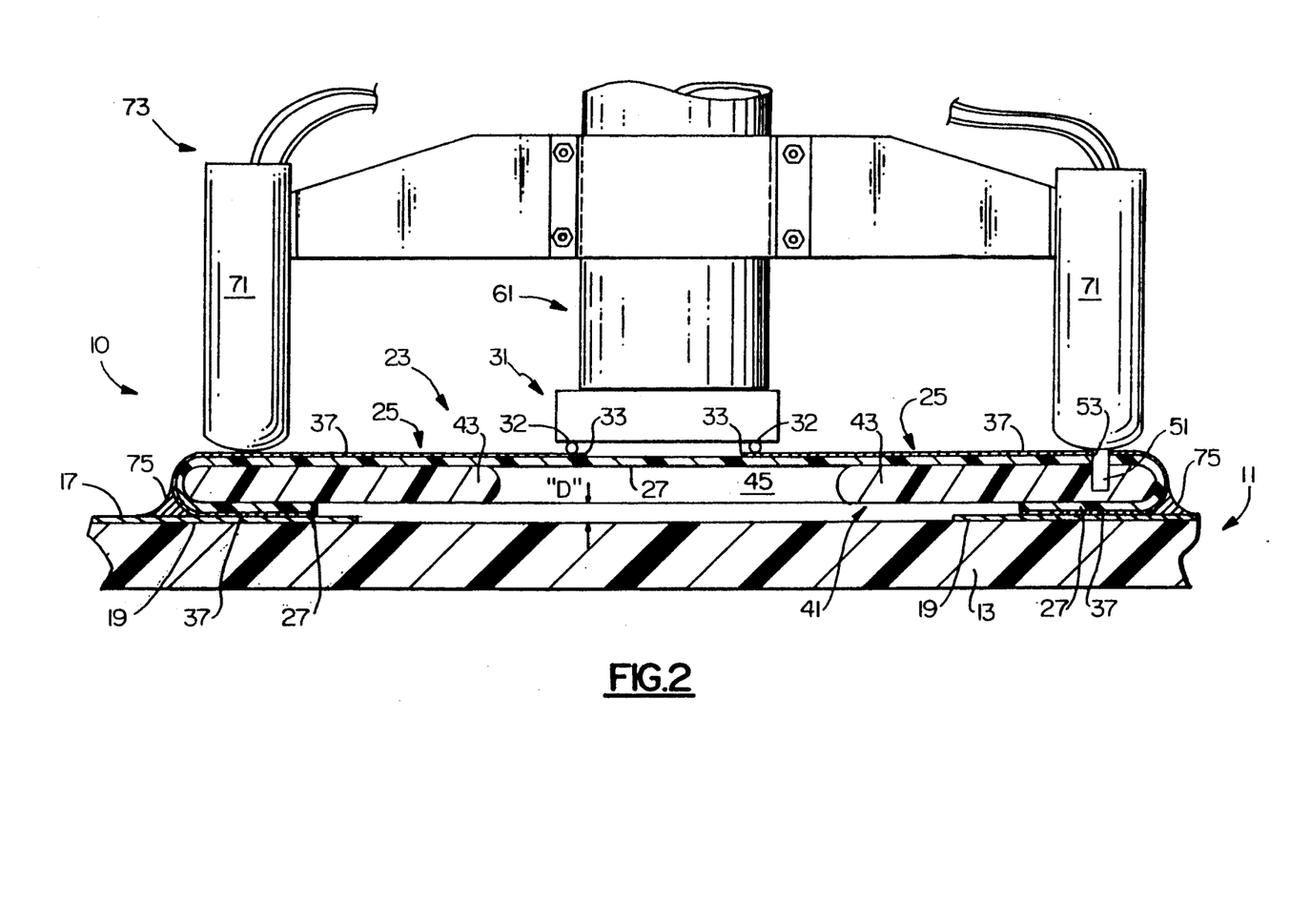
FIG. 2 is an enlarged view, taken in section, of the package of FIG. 1, including a showing of the apparatus which may be used to assemble at least part of the package.
Figure 5:
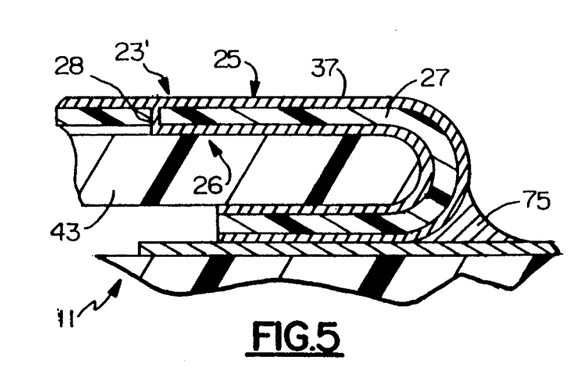
FIG. 5 is a partial view, enlarged and in section over the views in FIGS. 2 and 4, illustrating a flexible circuitized substrate in accordance with an alternative embodiment of the invention, having a portion thereof wrapped about the invention's frame.

The configuration for circuitry 25 as depicted in FIGS. 1 and 2 is not meant to limit the invention. Specifically, it is also possible to utilize additional layers of such circuitry in accordance with the teachings herein. For example, it is possible to provide an additional conductive plane 26 (e.g., ground) on the opposite side of dielectric layer 27 from that of conductors 25 as shown, to thus enhance the electrical performance capabilities of substrate 23. Selected areas of this underlying conductive plane can be coupled to respective ones of the conductors 25 through known techniques, including the provision of conductive vias or plated through holes, as is known in the art. Attention is directed to FIG. 5 and also the additional description provided below. It is also within the scope of the invention to provide interim conductive layers (not shown) as part of the flexible circuitized substrate while still assuring the necessary flexibility thereof. Such interim layers could also be electrically coupled to the upper circuitry 25 using the aforementioned vias or plated through holes, in addition to also being coupled to an underlying conductor layer as described above.

It is understood in FIG. 1 that a portion (that nearest the viewer) of the flexible circuitized substrate 23 as shown in section has been removed for illustration purposes and that this portion would possess a similar configuration to that of the other three corners of this substantially rectangular structure. Similar removal, for illustration purposes, is provided in FIG. 3.

In order to accomplish the described precise alignment and positioning of the invention's flexible circuitized substrate with respect to substrate 11, package 10 further includes a frame 41 which, as defined herein, includes at least part thereof which is designed for being spacedly positioned from the upper surface 17 of substrate 11 and, significantly, for having a portion of the flexible substrate 23 wrapped thereabout such that the conductors on these wrapped portions will form an electrical connection with respective conductors 15 on substrate 11. Frame 41, as shown in FIGS. 1 and 2, is preferably of substantially rectangular configuration, including four longitudinal sides 43 which define an opening 45 therein. Opening 45, in the embodiment of the invention as depicted in FIGS. 1 and 2, is also of substantially rectangular configuration. As with the flexible substrate in FIG. 1, it is understood that the two sides nearest the viewer in FIG. 1 converge to form a unitary structure for frame 41, the portions of the sides being removed in FIG. 1 for illustration purposes. Phantom lines are used in FIG. 1 to illustrate the joining of these two nearest sides.

In a preferred embodiment of the invention, frame 41 is comprised of a plastic material (a preferred example of such material being Ryton, a trademark of the Phillips Petroleum Company). Other plastic materials suitable for use with the present invention include Teflon (a trademark of E. I. duPont de Nemours and Co.). It is preferred that the material for frame 41 possess a coefficient of thermal expansion (CTE) which is substantially compatible with that of the dielectric 27 and 13 used for the invention's flexible and first substrates, respectively. By way of example, the aforementioned plastic material possessed a CTE of about 17 p.p.m./degrees Celsius (degrees C.), while the metal-dielectric (copper-polyimide) flexible circuit possessed substantially the same CTE. The described fiberglass-reinforced resin material, used for substrate 11, possessed a CTE of about 18 p.p.m./degrees C. Use of such an insulative material for frame 41 is also essential in those embodiments of the invention wherein an additional conductive layer (as described above) may be utilized on the under side of the flexible substrate, in addition to the illustrated upper layer of conductors 25, such an embodiment shown in FIG. 5. In an alternative embodiment, a metallic material (e.g., copper, stainless steel) may be utilized for such an embodiment, provided an insulative coating (e.g., polyimide) is located thereon for dielectric purposes. A dielectric coating is provided thereon for insulation purposes. Should only a single conductive layer be used for flexible substrate 23, no such additional coating would be necessary.

As shown in greater detail in FIG. 2, the sides 43 are spaced at a distance ("D") from the lower substrate's upper surface 17. In one embodiment of the invention, this distance was about 0.013 inch. It is also seen in FIG. 2, that semiconductor device 31 is located on the opposite side of the flexible circuit 23 from the provided opening 45 within frame 41. Provision of such an opening serves to reduce the weight of the assembly and to enhance mechanical flexibility.

Flexible substrate 23 is positioned on frame 41 and secured thereto using a suitable adhesive. One such example of an adhesive for this purpose is sold under the product designation CHR-XA252, and is available from the Chemical Hard Rubber Division of the Furon Company, New Haven, Conn. Such an adhesive is preferably applied to the upper surface of the frame's four sides 43 and the flexible substrate pressed thereon. Additionally, it may also be desirable to place the flexible substrate in tension prior to such attachment using conventional apparatus known in the art. Having the flexible substrate in tension may be considered worthwhile to make the flexible substrate sufficiently planar relative to frame 41. With substrate 23 bonded to the frame's upper surfaces, the outer edges of the substrate are wrapped around the frame's outer peripheral edges to form the configuration as illustrated herein. Adhesive is also preferably used on the frame's under surface at these locations to effect final securement.

In an alternative embodiment to use of adhesive for securing the flexible circuitized substrate 23 to frame 41, pins 51 may be utilized. As shown in FIG. 2, such pins 51 may be inserted within (or form integral extensions thereof) designated sides 43 of the frame and project upwardly for being positioned within corresponding openings 53 formed within the flexible substrate. In one embodiment, pins made of Ryton may be used, these pins frictionally inserted within corresponding apertures within the designated frame sides. Reinforcement material (e.g., copper, not shown) may be provided on the substrate's upper surface about such apertures, to assist in preventing possible deformation (e.g., tearing) of the relatively thin flexible substrate.

With flexible circuitized substrate 23 wrapped about frame 41 and secured thereto, including having semiconductor device 31 electrically coupled (e.g., soldered) in the manner defined above, this subassembly is next aligned with the respective circuitry on the lower, first substrate 11 such that the individual conductors 25 of the flexible substrate will be electrically coupled to respective pads 19 of the conductors 15 on the lower substrate. In a preferred embodiment of the invention, this aligning and positioning is accomplished using a vacuum device 61 (FIG. 2) which lowers to engage the upper surface of device 31 and thus hold the chip, and the underlying flexible substrate and frame, in an elevated position above the conductors 15. The subassembly is then lowered to engage the conductors 15 in the manner shown in FIG. 2. Significantly, permanent connections are then formed between the respective aligned pairs of conductors of both circuitized substrates. In a preferred embodiment of the invention, such permanent connections are formed using solder. Such a procedure may be accomplished by one of two techniques; remelting of previously applied solder on the lower substrate's pads 19, or reflowing of solder paste also previously applied to such pads. In the first of these techniques, solder is applied to the pads 19 using a wave solder process and apparatus known in the industry. Such a procedure causes a wave of solder to be passed by and contact with wettable pads 19, resulting in the deposition of a small amount of this solder on each pad. These pads are electrically isolated from each other by a surrounding coating of non-wetting material, one example being Probimer 52, available from the Ciba-Geigy Corporation. (Probimer is a trademark of Ciba-Geigy.) In a preferred embodiment of the invention wherein such a technique was utilized, the preferred solder applied using this wave technique was a 63:37 eutectic tin:lead solder, known in the art. With this solder applied to the respective pads 19, the flexible circuit-frame-chip subassembly is then lowered such that the outer, wrapped conductors 25 on the flexible substrate engage respective coated conductors 19. Heat is then applied using a technique known in the art, one example being to use hot contact thermodes 71 (FIG. 2) which, as shown in FIG. 2, may constitute extensions of the overall apparatus 73 which includes suction device 61. These thermodes 71 engage the outer peripheries of the wrapped flexible circuitized substrate to apply heat thereto, which heat passes around the conductors 25 to melt the solder and cause it to reflow, causing a substantial mechanical and electrically conductive bond between the subassembly and lower substrate members. Precise positioning of the described subassembly relative to the lower substrate may be accomplished using split optics which key on the lower substrate and subassembly (e.g., at registration points thereof). Other apparatus which may be used for applying heat at this location of the invention's subassembly include proximity hot air thermodes. Alternatively, both lower substrate and subassembly may be placed in a suitable and heated oven. Heating of the flexible circuitized substrate is accomplished, as defined above with the contact thermodes 71, until solder reflow occurs (e.g., at a temperature of about 250 degrees Celsius (C.)). This reflowed solder is represented by the numerals 75 in FIG. 2.

In the second example of applying the subassembly as defined above, a predetermined amount of solder paste is applied to the respective pads 19, preferably using a screening technique, various types of which are known. The subassembly is then located, again using a vacuum apparatus as defined above, such that the flexible substrate's individual conductors align with corresponding pads 19 on the lower substrate. The subassembly is then lowered until contact between respective conductors occurs, following which the paste is then reflowed. Two preferred techniques for accomplishing such paste reflow are to either use directed hot air or to place the subassembly and lower substrate within an oven. A preferred solder paste is 63:37 tin:lead solder paste, available from Alpha Metals, Incorporated. Should an oven be utilized, full reflow of the described solder may be accomplished by placing the subassembly and lower substrate within the oven at a temperature of about 250 degrees C. for approximately 1.5 to five minutes.

Following formation of the above connections, the vacuum is then released and apparatus 73 withdrawn.

Figure 4:
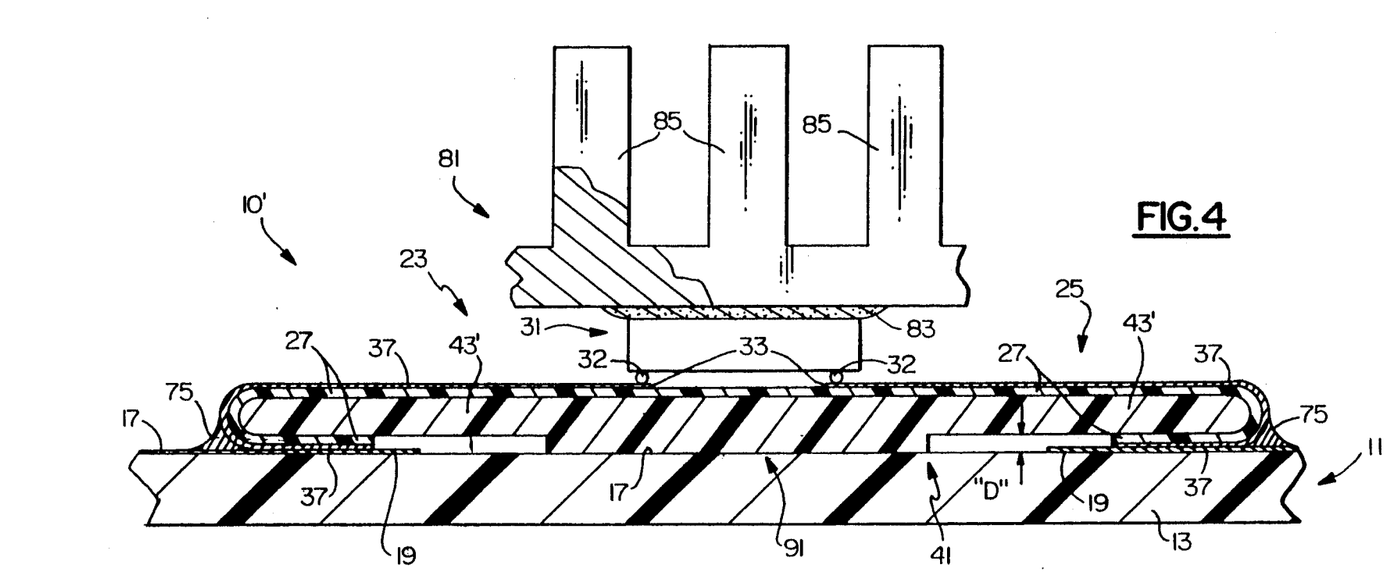
FIG. 4 is an enlarged view, taken in section, of the package of FIG. 3, further illustrating a heat sink member which may form part thereof.

To complete formation of package 10, it may also be desirable to add a heat sink 81 (FIG. 4), which is preferably metallic (e.g., aluminum) and is positioned over the wrapped flexible substrate and frame elements in the manner shown in FIG. 4. Typically, such a heat sink may include outer leg portions (not shown) which physically engage respective locations on the upper surface of the lower substrate 11. The semiconductor device 31 is preferably thermally coupled to this heat sink using an adhesive, one example being available in the industry from the Minnesota Mining and Manufacturing Company under the trade designation "Scotchcast". Such a composition includes about 47 percent (%) by weight of an epoxy polymer, about 52% by weight of a hardener and flexiblizer mixture, and about 0.4% by weight of a coloring agent. The hardener and flexiblizer mixture contains about 25% to 39% of hexahydrophthalic anhydride, about 50% to about 75% by weight of polypropylene glycol and/or polyoxypropylene glycol flexiblizer, about 0.85% to about 1% by weight of a tertiary amine, and a minor amount of hexahydrophthalic acid. This adhesive is known in the art and further description is not believed necessary. Such an adhesive is represented by the numeral 83 in FIG. 4. Heat sink 81, as is known in the art, may also include a plurality of fins 85 for promoting heat removal.

Figure 3:
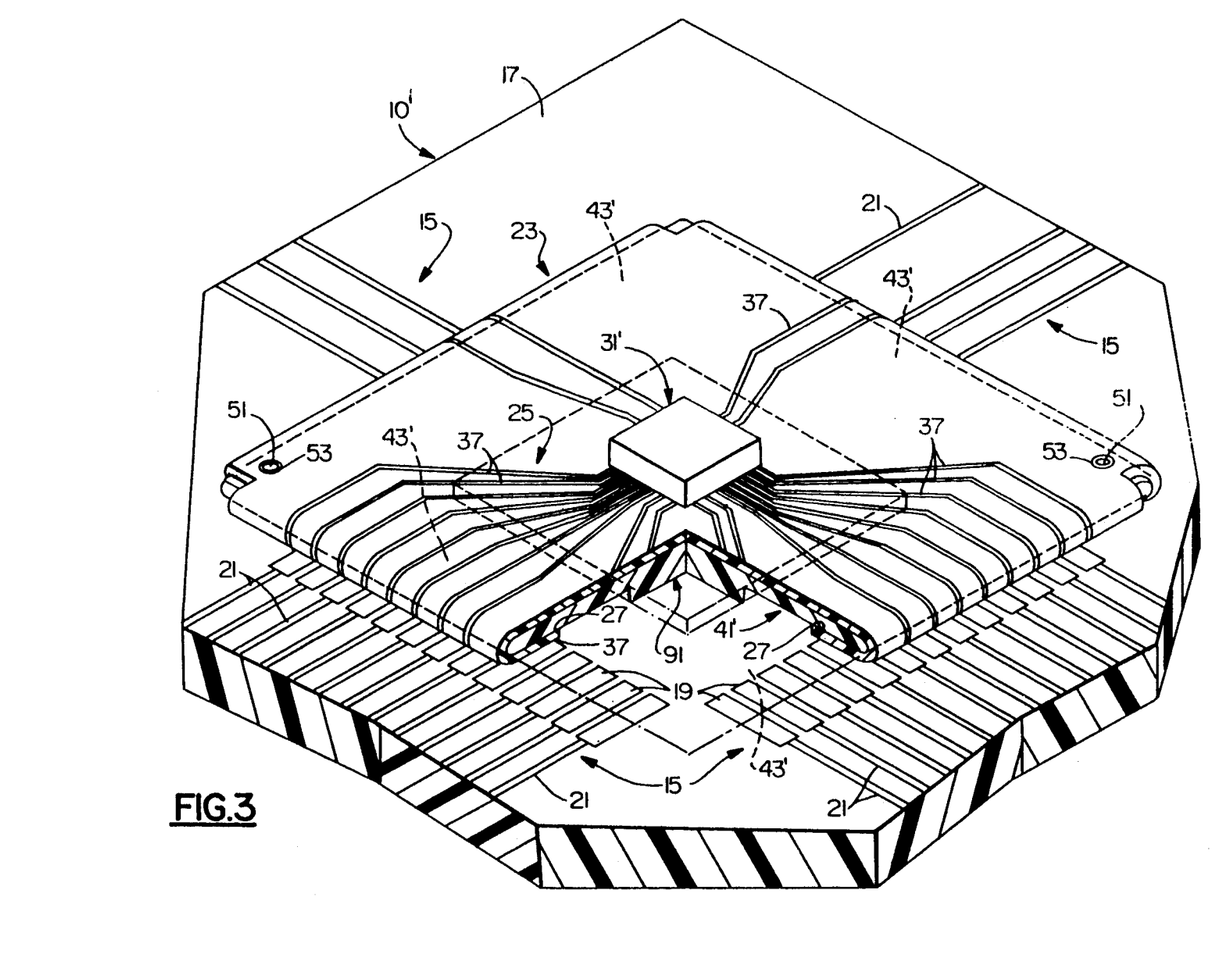
FIG. 3 is a partial perspective view of an electronic package in accordance with another embodiment of the invention.

In FIGS. 3 and 4, there is shown an electronic package 10' in accordance with an alternative embodiment of the invention. Package 10' is substantially similar to package 10 in FIGS. 1 and 2 with the exception of the addition of a standoff portion 91 at the central location of the frame (now 41') in place of the defined opening 45 for the frame 41 in FIGS. 1 and 2. Thus, a substantially solid and planar upper portion for the frame is provided, including, of course, the outer side members (43' in FIGS. 3 an 4) which are spaced (dimension "D") from the lower substrate's upper surface 17. Standoff portion 91 physically engages the upper surface 17 and rests thereon and, significantly, serves to support the semiconductor device 31 such that this device will be maintained at a precise distance from the lower substrate at all times. This standoff can further serve, through appropriate material selection, as a thermal conductor through which heat can be removed from chip 31. Standoff portion 91, as shown in FIGS. 3 and 4, is preferably of substantially rectangular configuration and is thus located directly opposite semiconductor device 31. All the remaining elements of package 10' remain the same as those in package 10, and thus similar numerals are used to illustrate such similar elements.

Positioning of the flexible substrate-frame-semiconductor device subassembly in the embodiment of FIGS. 3 and 4 is accomplished substantially similarly to that of the subassembly in FIGS. 1 and 2. Further description is thus not believed necessary.

In FIG. 5, there is shown in much greater detail an alternative embodiment of a flexible circuitized substrate 23' for use with the present invention. Substrate 24' includes the earlier defined upper layer of conductors 25 thereon as located on the described dielectric 27 (e.g., polyimide). Substrate 23', as mentioned above, further includes a second conductive layer 26 located on the opposite side of the dielectric 27 from the upper layers of conductors 25. As mentioned above, this second, lower layer 26 of conductors may be electrically coupled to respective ones of the conductors 25 (e.g., using a plated through hole 28). As described, the use of additional layers of circuitry further increases the operational capabilities of the present invention.

Thus there has been shown and described an electronic package and method of making same wherein the package includes a flexible circuitized substrate wrapped about an appropriate frame which in turn serves to position the substrate in a precise manner relative to another substrate such that conductors on both substrates may be electrically coupled to form a final package structure. Such a resulting structure assures high density connections as is highly desired in the packaging industry, and particularly that portion of the industry dedicated to information handling systems (computers). Significantly, the flexible circuitized substrate of the invention does not require selective removal of portions of the substrate's dielectric (e.g., polyimide) using such a relatively harsh process as etching in order to expose terminal ends of the substrate's conductors.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package comprising:
   a first circuitized substrate including an upper surface having a first plurality of conductors located thereon;
   a frame having at least a part thereof including opposing upper and lower surfaces, said part being spacedly positioned from said upper surface of said first circuitized substrate;
   a flexible circuitized substrate including a dielectric layer having a second plurality of conductors thereon, said flexible circuitized substrate secured to said part of said frame spacedly positioned from said first circuitized substrate and including at least one portion thereof wrapped about said part of said frame such that said portion of said flexible circuitized substrate is located on both said upper and lower opposing surfaces of said part, selected ones of said second plurality of conductors on said wrapped portion on said lower surface of said part being aligned with respective ones of said conductors on said upper surface of said first circuitized substrate in a facing orientation, and being electrically coupled thereto; and
   a semiconductor device positioned on said flexible circuitized substrate and electrically coupled to said selected ones of said second plurality of conductors located on said wrapped portion of said flexible circuitized substrate located on said upper surface of said part of said frame.

2. The package according to claim 1 wherein said first circuitized substrate comprises a printed circuit board.

3. The package according to claim 1 wherein said frame includes an opening therein, said semiconductor device being positioned on said flexible circuitized substrate on a side thereof substantially opposite said opening.

4. The package according to claim 3 wherein said frame is of substantially rectangular configuration and includes four side members substantially surrounding said opening, said portion of said flexible circuitized substrate wrapped about said frame being wrapped about at least two of said side members.

5. The package according to claim 1 wherein said frame includes a standoff portion for being located on said upper surface of said first circuitized substrate to maintain said part of said frame at said spacedly positioned orientation from said first circuitized substrate, said semiconductor device being positioned on said flexible circuitized substrate opposite said standoff portion.

6. The package according to claim 5 wherein said frame is of substantially rectangular configuration and includes four side members substantially surrounding said standoff portion, said portion of said flexible circuitized substrate wrapped about said frame being wrapped about at least two of said side members.

7. The package according to claim 1 wherein said flexible circuitized substrate is secured to said frame utilizing an adhesive.

8. The package according to claim 1 wherein said flexible circuitized substrate is secured to said frame utilizing at least one pin, said flexible circuitized substrate including at least one aperture therein, said pin located on or forming part of said frame and being positioned within said aperture.

9. The package according to claim 1 wherein said flexible circuitized substrate is positioned in tension on said frame.

10. The package according to claim 1 wherein said semiconductor device is electrically coupled to said selected ones of said second plurality of conductors on said flexible circuitized substrate by solder.

11. The package according to claim 1 wherein said selected ones of said second plurality of conductors on said flexible circuitized substrate are electrically coupled to said respective ones of said conductors on said first circuitized substrate by solder.

12. The package according to claim 1 wherein said flexible circuitized substrate further includes a third plurality of conductors located on an opposite side of said dielectric layer from said second plurality of conductors and electrically coupled to said second plurality of conductors through said dielectric layer.

13. The package according to claim 1 further including a heat sink, said semiconductor device being thermally coupled to said heat sink.

14. The package according to claim 1 wherein said first circuitized substrate includes dielectric material, said frame having a coefficient of thermal expansion substantially similar to the coefficients of thermal expansion of both said dielectric material of said first circuitized substrate and said dielectric layer of said flexible circuitized substrate.

15. The package according to claim 14 wherein said frame is comprised of plastic.

16. A method of making an electronic package, said method comprising:
   providing a first circuitized substrate including an upper surface having a first plurality of conductors located thereon;
   providing a flexible circuitized substrate including a dielectric layer having a second plurality of conductors thereon;
   securing said flexible circuitized substrate having said second plurality of conductors to a frame such that at least a portion of said flexible circuitized substrate is wrapped about a part of said frame having opposing upper and lower surfaces such that said wrapped portion is located on both said upper and lower surfaces of said part;
   spacedly positioning said part of said frame having said flexible circuitized substrate wrapped about said part from said first circuitized substrate and aligning selected ones of said second plurality of conductors on said wrapped portion of said flexible circuitized substrate on said lower surface of said part to respective ones of said first plurality of conductors in a facing orientation, and thereafter electrically coupling said selected ones of said second plurality of conductors to said respective ones of said first plurality of conductors; and positioning a semiconductor device on said flexible circuitized substrate and electrically coupling said device to said selected ones of said second plurality of conductors located on said wrapped portion of said flexible circuitized substrate located on said upper surface of said part of said frame.

17. The method according to claim 16 wherein said semiconductor device is positioned on said flexible circuitized substrate and electrically coupled to said second plurality of conductors prior to said spacedly positioning of said frame having said flexible circuitized substrate secured thereto and wrapped about part thereof relative to said first circuitized substrate.

18. The method according to claim 17 wherein said positioning of said frame having said flexible circuitized substrate secured thereto and wrapped about part thereof is accomplished by engaging said semiconductor device and thereafter moving said device and said flexible circuitized substrate and frame to said position relative to said first circuitized substrate.

19. The method according to claim 18 wherein said engaging of said semiconductor device is accomplished by using a vacuum device.

20. The method according to claim 16 wherein said selected ones of said second plurality of conductors on said flexible circuitized substrate are electrically coupled to said respective ones of said first plurality of conductors using a soldering process.

21. The method of claim 20 wherein said soldering process involves depositing solder on said respective ones of said first plurality of conductors, thereafter causing said selected ones of said second plurality of conductors to engage the solder on said respective ones of said first plurality of conductors, and thereafter heating said solder to form an electrical connection between said respective ones of said first conductors and said selected ones of said second conductors.

22. The method according to claim 16 wherein said flexible circuitized substrate includes a dielectric material having said second plurality of conductors thereon, portions of said dielectric material not being removed by etching or the like processes to expose terminal end portions of said second plurality of conductors thereon.

23. The method according to claim 16 further including the steps of providing said first circuitized substrate having a dielectric material as part thereof and providing said frame of a material having a coefficient of thermal expansion substantially similar to both the coefficients of thermal expansion of said dielectric material of said first circuitized substrate and said dielectric layer of said flexible circuitized substrate.

* * * * *